United States Patent
Liu et al.

(10) Patent No.: US 11,322,562 B2
(45) Date of Patent: May 3, 2022

(54) ORGANIC LIGHT-EMITTING DIODE DISPLAY PANEL AND METHOD OF FABRICATING ORGANIC LIGHT-EMITTING DIODE DISPLAY PANEL

(71) Applicant: Shenzhen China Star Optoelectronics Semiconductor Display Technology Co., Ltd., Shenzhen (CN)

(72) Inventors: Yang Liu, Shenzhen (CN); Yingchun Fan, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 350 days.

(21) Appl. No.: 16/496,962

(22) PCT Filed: Aug. 5, 2019

(86) PCT No.: PCT/CN2019/099280
§ 371 (c)(1),
(2) Date: Sep. 24, 2019

(87) PCT Pub. No.: WO2020/220497
PCT Pub. Date: Nov. 5, 2020

(65) Prior Publication Data
US 2022/0005892 A1    Jan. 6, 2022

(30) Foreign Application Priority Data
Apr. 30, 2019    (CN) .......................... 201910364595.1

(51) Int. Cl.
*H01L 27/32*    (2006.01)
*H01L 51/52*    (2006.01)
*H01L 51/56*    (2006.01)

(52) U.S. Cl.
CPC .......... *H01L 27/3246* (2013.01); *H01L 51/52* (2013.01); *H01L 51/56* (2013.01); *H01L 2227/323* (2013.01)

(58) Field of Classification Search
None
See application file for complete search history.

(56) References Cited

U.S. PATENT DOCUMENTS

2016/0268354 A1    9/2016  Xiong et al.
2018/0342563 A1   11/2018  You et al.
(Continued)

FOREIGN PATENT DOCUMENTS

| CN | 104659070 | 5/2015 |
| CN | 107104130 | 8/2017 |
| CN | 109216413 | 1/2019 |

*Primary Examiner* — Michelle Mandala

(57) ABSTRACT

The present disclosure provides a method of fabricating an organic light-emitting diode (OLED) display panel and an organic light-emitting diode (OLED) display panel. The OLED display panel includes a substrate; a driving circuit layer formed on the substrate; a pixel defining layer; and a light emitting functional layer, which are stacked. Protrusions are provided on a surface of the pixel defining layer away from the driving circuit layer in at least one of a plurality of pixel defining regions, and the light emitting functional layer is formed on the pixel defining layer and covers the sub-pixel regions. By forming the protrusions, a lateral transmission path of charges between adjacent sub-pixels is increased, resulting in a reduction in light leakage.

20 Claims, 4 Drawing Sheets

(56) References Cited

U.S. PATENT DOCUMENTS

2019/0006443 A1   1/2019  Hanashima et al.
2019/0067389 A1*  2/2019  Ai .................... H01L 51/5072
2021/0057497 A1*  2/2021  Hou ................. H01L 51/0018

* cited by examiner

ORGANIC LIGHT-EMITTING DIODE DISPLAY PANEL AND METHOD OF FABRICATING ORGANIC LIGHT-EMITTING DIODE DISPLAY PANEL

RELATED APPLICATIONS

This application is a National Phase of PCT Patent Application No. PCT/CN2019/099280 having International filing date of Aug. 5, 2019, which claims the benefit of priority of Chinese Patent Application No. 201910364595.1 filed on Apr. 30, 2019. The contents of the above applications are all incorporated by reference as if fully set forth herein in their entirety.

FIELD AND BACKGROUND OF THE INVENTION

The present disclosure relates to the field of display technologies, and in particular, to a method of fabricating an organic light-emitting diode (OLED) display panel and an organic light-emitting diode (OLED) display panel.

In the prior art, technology of an organic light-emitting diode (OLED) display continues to develop toward a high resolution. As the resolution increases, pitches of sub-pixels in the display panel are designed to be smaller and smaller, resulting in a light leakage phenomenon, that is, undriven sub-pixels close to driven sub-pixels in the OLED display panel are also weakly illuminating, which impacts a display quality.

Therefore, the existing OLED display panel has technical problems of light leakage and needs to be improved.

SUMMARY OF THE INVENTION

The present disclosure provides a method of fabricating an organic light-emitting diode (OLED) display panel and an organic light-emitting diode (OLED) display panel to alleviate the technical problem of light leakage in the existing OLED display panel.

To solve the above problems, the technical solution provided by the present disclosure is as follows:

The present disclosure provides an organic light-emitting diode (OLED) display panel, including: a substrate; a driving circuit layer formed on the substrate; a pixel defining layer formed on the driving circuit layer for defining a plurality of sub-pixel regions, wherein the pixel defining layer includes a plurality of pixel defining regions, and protrusions are provided on a surface of the pixel defining layer away from the driving circuit layer in at least one of the plurality of pixel defining regions; and a light emitting functional layer formed on the pixel defining layer and covering the plurality of sub-pixel regions.

In the OLED display panel of the present disclosure, the pixel defining layer is integrally formed in the at least one of the plurality of pixel defining regions.

In the OLED display panel of the present disclosure, all of the protrusions have a same cross-sectional shape.

In the OLED display panel of the present disclosure, the protrusions have a trapezoidal cross-sectional shape.

In the OLED display panel of the present disclosure, the protrusions have a rectangular cross-sectional shape.

In the OLED display panel of the present disclosure, at least one of the protrusions has a cross-sectional shape different from other protrusions.

In the OLED display panel of the present disclosure, in the at least one pixel defining region, the pixel defining layer comprises at least a first sub-pixel defining layer and a second sub-pixel defining layer, which are both disposed on the driving circuit layer.

In the OLED display panel of the present disclosure, each of the first sub-pixel defining layer and the second sub-pixel defining layer has a planar surface away from the driving circuit layer, and a height of the first sub-pixel defining layer is greater than a height of the second sub-pixel defining layer.

In the OLED display panel of the present disclosure, the first sub-pixel defining layer and the second sub-pixel defining layer have planar surfaces of a same height away from the driving circuit layer, and projections of the surfaces of the first sub-pixel defining layer and the second sub-pixel defining layer away from the driving circuit layer on the driving circuit layer are not connected with each other.

In the OLED display panel of the present disclosure, a surface of at least one of the first sub-pixel defining layer and the second sub-pixel defining layer away from the driving circuit layer is formed with the protrusions in at least one of the pixel defining regions.

In the OLED display panel of the present disclosure, all of the protrusions in each of the sub-pixel defining layers have a same cross-sectional shape.

In the OLED display panel of the present disclosure, the protrusions have a trapezoidal cross-sectional shape.

In the OLED display panel of the present disclosure, the protrusions have a rectangular cross-sectional shape.

In the OLED display panel of the present disclosure, in each of the sub-pixel defining layers, at least one of the protrusions has a cross-sectional shape different from other protrusions.

In the OLED display panel of the present disclosure, the cross-sectional shapes of the protrusions provided on the surfaces of the first sub-pixel defining layer and the second sub-pixel defining layer away from the driving circuit layer are same.

In the OLED display panel of the present disclosure, the cross-sectional shapes of the protrusions provided on the surfaces of the first sub-pixel defining layer and the second sub-pixel defining layer away from the driving circuit layer are same.

In the OLED display panel of the present disclosure, in the pixel defining regions formed with the protrusions, a portion of the pixel defining layer has an integrally formed structure, and another portion of the pixel defining layer includes at least a first sub-pixel defining layer and a second sub-pixel defining layer which are both disposed on the driving circuit layer.

The present disclosure also provides a method of fabricating an organic light-emitting diode (OLED) display panel, including: providing a substrate; forming a driving circuit layer on the substrate; forming a pixel defining layer on the driving circuit layer, the pixel defining layer being configured to define and include a plurality of sub-pixel regions, and providing protrusions on a surface of the pixel defining layer away from the driving circuit layer in at least one of the pixel defining regions; and forming a light emitting functional layer on the pixel defining layer and in the plurality of sub-pixel regions.

In the method of fabricating the OLED display panel of the present disclosure, the step of forming a pixel defining layer on the driving circuit layer, the pixel defining layer being configured to define and include a plurality of sub-pixel regions, and providing protrusions on a surface of the pixel defining layer away from the driving circuit layer in at least one of the pixel defining regions comprises: integrally forming a pixel defining layer in the at least one of the pixel defining regions.

In the method of fabricating the OLED display panel of the present disclosure, the step of forming a pixel defining layer on the driving circuit layer, the pixel defining layer being configured to define and include a plurality of sub-pixel regions, and providing protrusions on a surface of the pixel defining layer away from the driving circuit layer in at least one of the pixel defining regions comprises: forming at least a first sub-pixel defining layer and a second sub-pixel defining layer in the at least one of the pixel defining regions, wherein the first sub-pixel defining layer and the second sub-pixel defining layer are both disposed on the driving circuit layer.

The beneficial effects of the present disclosure are: the present disclosure provides a method of fabricating an organic light-emitting diode (OLED) display panel including a substrate, a driving circuit layer, a pixel defining layer, and a light emitting functional layer, wherein the driving circuit layer is formed on the substrate, the pixel defining layer is formed on the driving circuit layer for defining a plurality of sub-pixel regions, the pixel defining layer includes a plurality of pixel defining regions, protrusions are provided on a surface of the pixel defining layer away from the driving circuit layer in at least one of the plurality of pixel defining regions, and the light emitting functional layer is formed on the pixel defining layer and covers the sub-pixel regions. By forming protrusions on the surface of the pixel defining layer away from the driving circuit layer, a lateral transmission path of charges between adjacent sub-pixels is increased, and occurrence of light leakage is reduced.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

Figure 1:
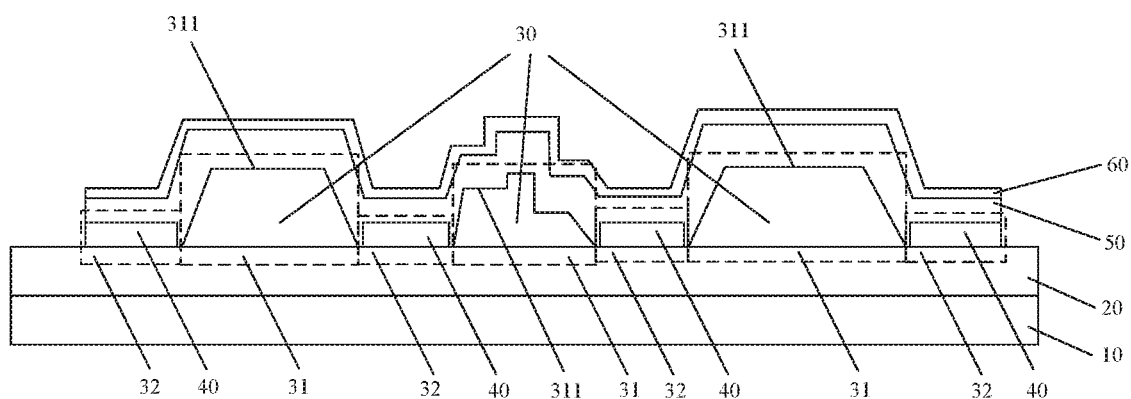
FIG. 1 is a schematic diagram of a first structure aspect of an organic light-emitting diode (OLED) display panel according to an embodiment of the present disclosure.
Figure 2A:
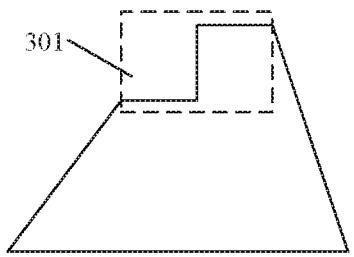
FIGS. 2a, 2b, 2c, and 2d are schematic structural diagrams of an organic light-emitting diode (OLED) display panel having a pixel defining layer provided with protrusions according to an embodiment of the present disclosure.
Figure 2B:
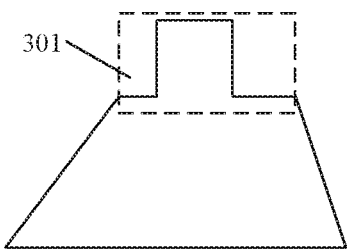
Figure 2C:
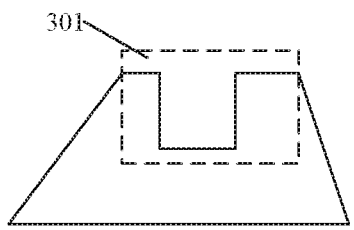
Figure 2D:
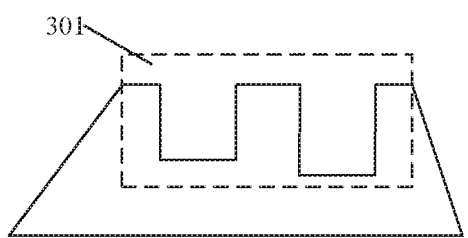

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

The present disclosure provides an organic light-emitting diode (OLED) display panel to alleviate the technical problem of light leakage in an existing OLED display panel.

FIG. 1 is a schematic diagram showing a first structure of an organic light-emitting diode (OLED) display panel provided by an embodiment of the present disclosure. The OLED display panel includes a substrate 10, a driving circuit layer 20, a pixel defining layer 30, a first electrode 40, a light emitting functional layer 50, and a second electrode 60.

The substrate 10 is typically a glass substrate, but is not particularly limited thereto, and may be, for example, a flexible substrate. The driving circuit layer 20 is formed on the substrate 10 and includes a plurality of thin film transistors (not shown) for driving the OLED display panel.

The pixel defining layer 30 is formed on the driving circuit layer 20. The pixel defining layer 30 includes a plurality of pixel defining regions 31. The pixel defining layer 30 is configured to define a plurality of sub-pixel regions 32. The sub-pixel regions 32 are formed between two adjacent pixel defining regions 31. In at least one of the pixel defining regions 31, protrusions are provided on the surface 301 of the pixel defining layer 30 away from the driving circuit layer 20.

The first electrode 40 is formed on the driving circuit layer 20 and is located in the sub-pixel region 32. A drain electrode of the thin film transistor in the driving circuit layer 20 can be electrically connected to the first electrode 40.

The light emitting functional layer 50 is formed on the pixel defining layer 30 and covers the first electrode 40 in the sub-pixel region 32, and the second electrode 60 is formed on the light emitting functional layer 50.

In an embodiment, the first electrode 40 is a transparent anode, the second electrode 60 is a metal cathode, and the OLED display panel is a bottom-emitting structure.

In an embodiment, the first electrode 40 is a metal anode, the second electrode 60 is a transparent cathode, and the OLED display panel is a top-emitting structure.

In an embodiment, the protrusions may be formed only on the surface 301 of the pixel defining layer 30 in a portion of the pixel defining region 31 away from the driving circuit layer 20, or may be formed on the surface 301 of the pixel defining layer 30 in all the pixel defining regions 31 away from the driving circuit layer 20.

In an embodiment, in the pixel defining region 31 formed with the protrusions, the pixel defining layer 30 is integrally formed, and the structure of the pixel defining layer 30 is as shown in FIG. 2.

As shown by "a" and "b" in FIG. 2, the surface 301 of the pixel defining layer 30 away from the driving circuit layer 20 includes a protrusion which may have a trapezoidal cross-sectional shape, a rectangular cross-sectional shape, or other cross-sectional shapes.

As shown by "c" in FIG. 2, the surface 301 of the pixel defining layer 30 away from the driving circuit layer 20 includes two protrusions, and a concave surface is formed between the two protrusions, and the protrusions may have a trapezoidal cross-sectional shape, a rectangular cross-sectional shape, or other cross-sectional shapes. The shapes and sizes of the two protrusions may or may not be equal.

As shown by "d" in FIG. 2, the surface 301 of the pixel defining layer 30 away from the driving circuit layer 20 includes three protrusions, and two concave surfaces are formed between the three protrusions, and the protrusions may have a trapezoidal cross-sectional shape, a rectangular cross-sectional shape, or other cross-sectional shapes. The shapes and sizes of the three protrusions may or may not be equal, and the three protrusions may be spaced apart from each other at equal intervals or at different intervals.

Of course, the shape of the surface 301 of the pixel defining layer 30 away from the driving circuit layer 20 is not limited thereto, and more protrusions may be formed. The protrusions may have straight surfaces or curved surfaces. The cross-sectional shapes of all the protrusions may be equal. Alternatively, at least one of the protrusions may have a cross-sectional shape different from the other protrusions, and all the protrusions may be arranged at equal intervals or may be arranged at unequal intervals.

When the OLED display panel is displayed, sub-pixels (not shown) located in the sub-pixel region 32 are not simultaneously driven, and charges in the driven sub-pixels may enter into adjacent undriven sub-pixels along the light-emitting functional layer 50 across a side and a top of the pixel defining layer 30, causing the undriven sub-pixels to faintly emit light, resulting in light leakage. Since the surface 301 of the pixel defining layer 30 away from the driving circuit layer 20 is provided with protrusions in the at least one of the pixel defining regions 31, the lateral transmission path of the charges in the light emitting functional layer 50 is increased, compared with a structure of a planar top surface, thereby alleviating occurrence of light leakage, improving the display quality.

Figure 3:
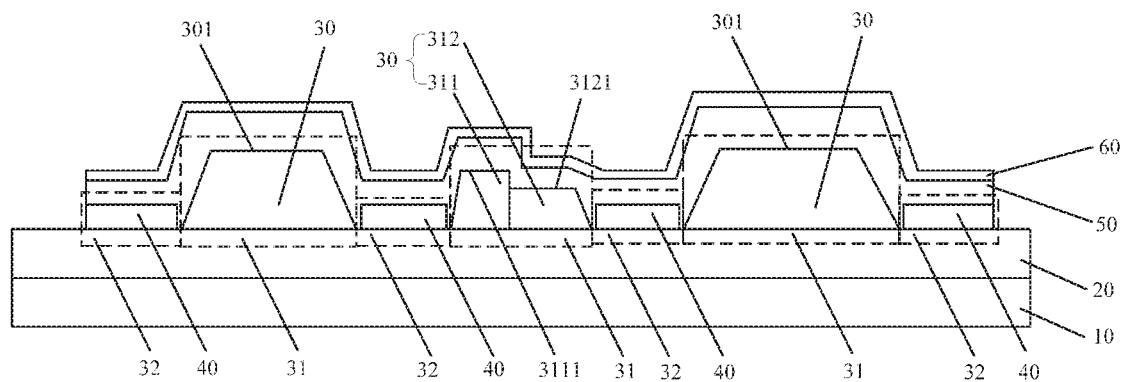
FIG. 3 is a schematic diagram of a second structure aspect of an organic light-emitting diode (OLED) display panel according to an embodiment of the present disclosure.

FIG. 3 is a schematic diagram of a second structure aspect of an organic light-emitting diode (OLED) display panel according to an embodiment of the present disclosure. As shown in FIG. 3, the organic light-emitting diode (OLED) display panel includes a substrate 10, a driving circuit layer 20, a pixel defining layer 30, a first electrode 40, a light emitting functional layer 50, and a second electrode 60.

The difference from the structure in FIG. 1 is that, in at least one of the pixel defining regions 31, the pixel defining layer 30 includes at least a first sub-pixel defining layer 311 and a second sub-pixel defining layer 312, and a first sub-pixel defining layer 311 and the second sub-pixel defining layers 312 are both disposed on the driving circuit layer 20.

In an embodiment, the surface 3111 of the first sub-pixel defining layer 311 away from the driving circuit layer 20 and the surface 3121 of the second sub-pixel defining layer 312 away from the driving circuit layer 20 are planar surfaces, and the first sub-pixel defining layer 311 has a height greater than the second sub-pixel defining layer 312.

Since the height of the first sub-pixel defining layer 311 is greater than the height of the second sub-pixel defining layer 312, the lateral transmission path of the charges in the light emitting functional layer 50 is increased compared to a structure of a planar top surface, thereby alleviating occurrence of light leakage, improving the display quality.

Figure 4:
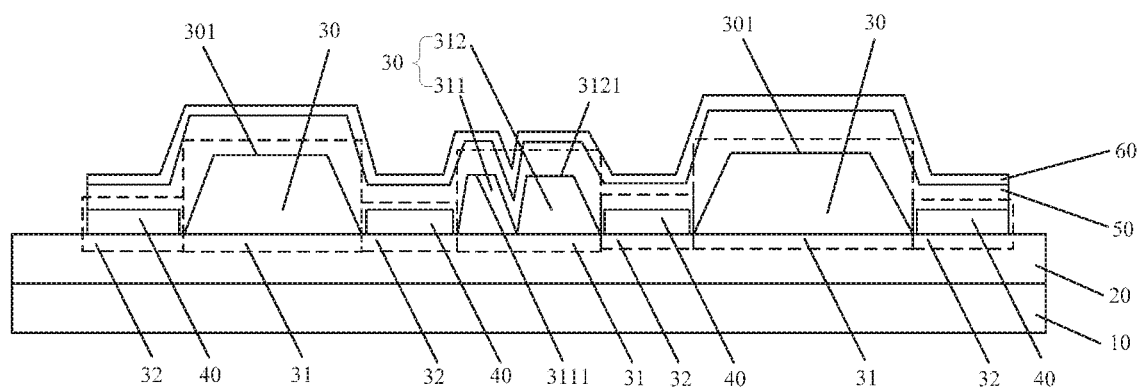
FIG. 4 is a schematic diagram of a third structure aspect of an organic light-emitting diode (OLED) display panel according to an embodiment of the present disclosure.

FIG. 4 is a schematic diagram showing a third structure of an organic light-emitting diode (OLED) display panel provided by an embodiment of the present disclosure. The OLED display panel includes a substrate 10, a driving circuit layer 20, a pixel defining layer 30, a first electrode 40, a light emitting functional layer 50, and a second electrode 60.

In the at least one of the pixel defining regions 31, the pixel defining layer 30 includes at least a first sub-pixel defining layer 311 and a second sub-pixel defining layer 312, and the first sub-pixel defining layer 311 and the second sub-pixel defining layer 312 are both disposed on the driving circuit layer 20.

In an embodiment, the surface 3111 of the first sub-pixel defining layer 311 away from the driving circuit layer 20 and the surface 3121 of the second sub-pixel defining layer 312 away from the driving circuit layer 20 are planar surfaces. The height of the first sub-pixel defining layer 311 is equal to the height of the second sub-pixel defining layer 312, and projection of the surface 3111 of the first sub-pixel defining layer 311 away from the driving circuit layer 20 and projection of the surface 3121 of the second sub-pixel defining layer 312 away from the driving circuit layer 20 are not connected with each other.

Therefore, the lateral transmission path of the charges in the light emitting functional layer 50 is increased compared to a structure of a planar top surface, thereby alleviating occurrence of light leakage, improving the display quality.

Figure 5:
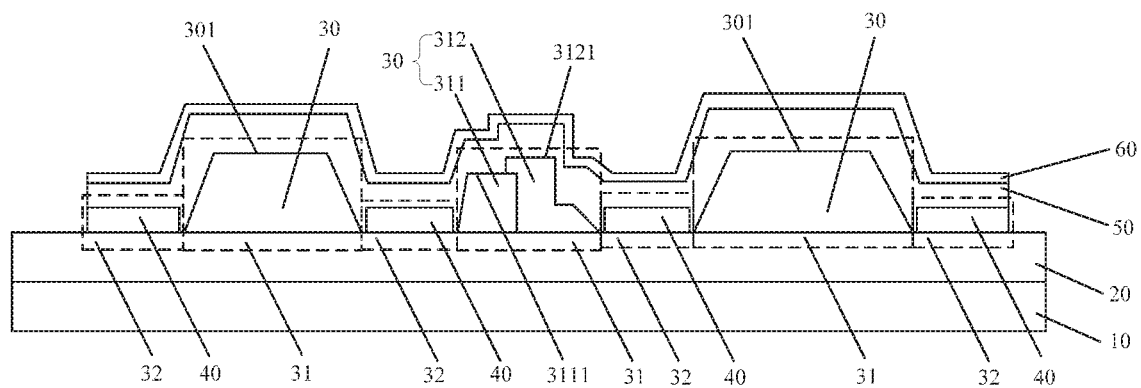
FIG. 5 is a schematic diagram of a fourth structure aspect of an organic light-emitting diode (OLED) display panel according to an embodiment of the present disclosure.

FIG. 5 is a schematic diagram of a fourth structure aspect of an organic light-emitting diode (OLED) display panel according to an embodiment of the present disclosure. As shown in FIG. 5, an organic light-emitting diode (OLED) display panel includes a substrate 10, a driving circuit layer 20, a pixel defining layer 30, a first electrode 40, a light emitting functional layer 50, and a second electrode 60.

In the at least one of the pixel defining regions 31, the pixel defining layer 30 includes at least a first sub-pixel defining layer 311 and a second sub-pixel defining layer 312, and the first sub-pixel defining layer 311 and the second sub-pixel defining layer 312 are both disposed on the driving circuit layer 20.

The first sub-pixel defining layer 311 has a planar surface 3111 away from the driving circuit layer 20, and the second sub-pixel defining layer 312 is formed with the protrusions on its surface 3121 away from the driving circuit layer 20.

The surface 3121 of second sub-pixel defining layer 312 away from the driving circuit layer 202 includes one or more protrusions. The protrusions may have a trapezoidal cross-sectional shape, a rectangular cross-sectional shape, or other cross-sectional shapes, and the protrusions may have straight surfaces or curved surfaces. The cross-sectional shapes of all the protrusions may be equal. Alternatively, at least one of the protrusions may have a cross-sectional shape different from the other protrusions, and all the protrusions may be arranged at equal intervals or may be arranged at unequal intervals.

Since the surface 3121 of the second sub-pixel defining layer 312 away from the driving circuit layer 20 is provided with protrusions, the lateral transmission path of the charges in the light emitting functional layer 50 is increased compared to a structure of a planar top surface, thereby alleviating occurrence of light leakage, improving the display quality.

Figure 6:
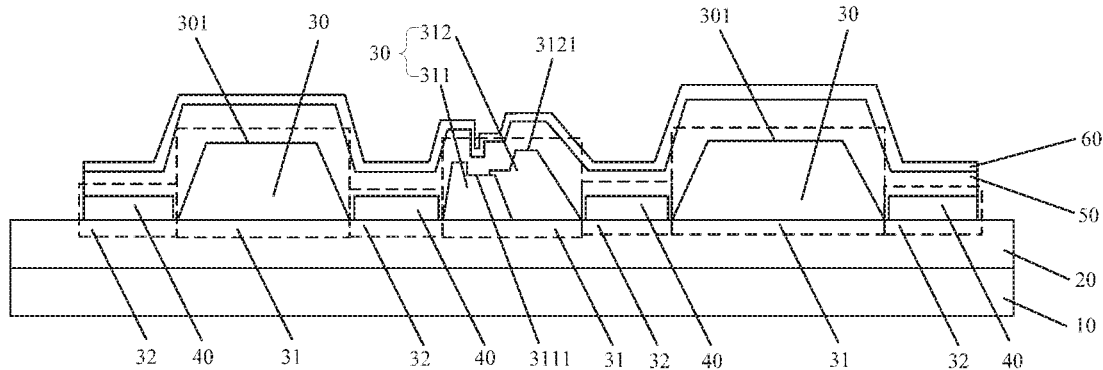
FIG. 6 is a schematic diagram of a fifth structure aspect of an organic light-emitting diode (OLED) display panel according to an embodiment of the present disclosure.

FIG. 6 is a schematic diagram showing a fifth structure aspect of an organic light-emitting diode (OLED) display panel according to an embodiment of the present disclosure.

As shown in FIG. 6, an OLED display panel includes a substrate 10, a driving circuit layer 20, a pixel defining layer 30, a first electrode 40, a light emitting functional layer 50, and a second electrode 60.

In the at least one of the pixel defining regions 31, the pixel defining layer 30 includes at least a first sub-pixel defining layer 311 and a second sub-pixel defining layer 312, and the first sub-pixel defining layer 311 and the second sub-pixel defining layer 312 are both disposed on the driving circuit layer 20.

The surface 3111 of the first sub-pixel defining layer 311 away from the driving circuit layer 20 and the surface 3121 of the second sub-pixel defining layer 312 away from the driving circuit layer 20 is provided with protrusions. The protrusions may have a trapezoidal cross-sectional shape, a rectangular cross-sectional shape, or other cross-sectional shapes, and the protrusions may have straight surfaces or curved surfaces. All the protrusions may be arranged at equal intervals or may be arranged at unequal intervals.

The cross-sectional shapes of all the protrusions of the first sub-pixel defining layer 311 away from the driving circuit layer 20 may be equal. Alternatively, at least one of the protrusions may have a cross-sectional shape different from the other protrusions. The cross-sectional shapes of all the protrusions of the second sub-pixel defining layer 312 away from the driving circuit layer 20 may be equal. Alternatively, at least one of the protrusions may have a cross-sectional shape different from the other protrusions.

When the cross-sectional shapes of all the protrusions on the surface 3111 of the first sub-pixel defining layer 311 away from the driving circuit layer 20 are the same, and the cross-sectional shapes of all the protrusions on the surface 3121 of the second sub-pixel defining layer 312 away from the driving circuit layer 20 are also the same, the cross-sectional shapes of all the protrusions in the two sub-pixel defining layers may be the same or different.

Since the surface 3111 of the first sub-pixel defining layer 311 away from the driving circuit layer 20 and the surface 3121 of the second sub-pixel defining layer 312 away from the driving circuit layer 20 are both provided with protrusions, the lateral transmission path of the charges in the light emitting functional layer 50 is increased compared to a structure of a planar top surface, thereby alleviating occurrence of light leakage, improving the display quality.

It should be noted that, in the at least one of the pixel defining regions 31, the pixel defining layer 30 is not particularly limited to the first sub-pixel defining layer 311 and the second sub-pixel defining layer 312. Instead, more sub-pixel defining layers may be included, and each of the sub-pixel defining layers may or may not be connected to each other, and may be a stacked arrangement or may be all disposed on the driving circuit layer 20.

In the OLED display panel of the present disclosure, in the pixel defining regions 31 formed with the protrusions, the pixel defining layers 30 may be integrally formed. Alternatively, at least two sub-pixel defining layers disposed on the driving circuit layer 20. Alternatively, a portion of the pixel defining layer 30 has an integrally formed structure, and another portion of the pixel defining layer 30 includes at least two sub-pixel defining layers disposed on the driving circuit layer 20.

Figure 7:
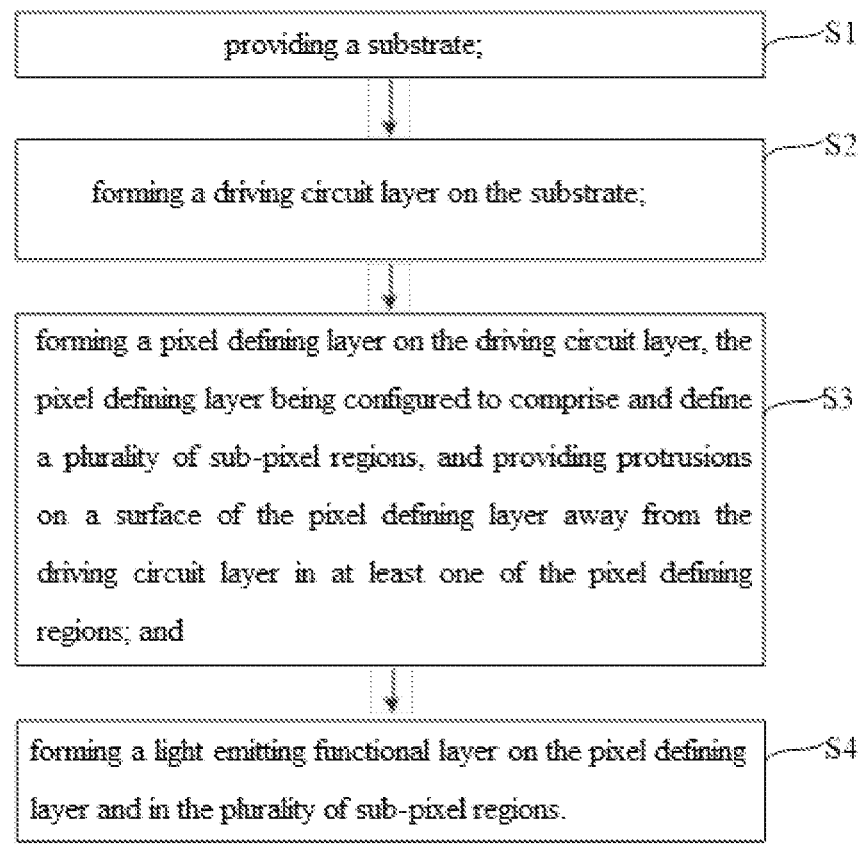
FIG. 7 is a schematic flow chart of a method of fabricating an organic light-emitting diode (OLED) display panel according to an embodiment of the present disclosure.

As shown in FIG. 7, the present disclosure further provides a method of fabricating an organic light-emitting diode (OLED) display panel, including the specific steps as follows:

Step S1: providing a substrate;

Step S2: forming a driving circuit layer on the substrate;

Step S3: forming a pixel defining layer on the driving circuit layer, the pixel defining layer being configured to define and include a plurality of sub-pixel regions, and providing protrusions on a surface of the pixel defining layer away from the driving circuit layer in at least one of the pixel defining regions; and Step S4: forming a light-emitting functional layer on the pixel defining layer and in the sub-pixel regions.

Each the steps are described in detail below.

In step S1, the substrate is first provided, and the substrate is typically a glass substrate, but is not particularly limited thereto, and may be, for example, a flexible substrate.

In step S2, a thin film transistor array, that is, a driving circuit layer, is formed on the substrate by coating, exposure, development, curing, film formation, lithography, and etching, etc., for a driving display device. Then, a first electrode is formed on the driving circuit layer by the processes such as film formation, lithography, and etching, etc., and a drain electrode of the thin film transistor in the driving circuit layer may be electrically connected to the first electrode.

In step S3, the pixel defining layer is formed on the driving circuit layer by the processes such as coating, exposure, development, curing, and the like. The pixel defining layer is configured to define a plurality of sub-pixel regions, the first electrode is located in the sub-pixel region, and the pixel defining layer includes a plurality of pixel defining regions, and the protrusions are provided on a surface of the pixel defining layer away from the driving circuit layer in at least one of the plurality of pixel defining regions.

In an embodiment, the pixel defining layer only in a portion of the pixel defining regions may be provided with protrusions on its surface away from the driving circuit layer. Alternatively, the pixel defining layer in all the pixel defining regions may be provided with protrusions on its surface away from the driving circuit layer.

In an embodiment, the pixel defining layer is integrally formed in the pixel defining regions formed with the protrusions that is, formed by one time of a coating, exposure, development, and curing process. By adjusting a position and a size of the mask, and an amount of exposure, etc., the protrusions may have straight surfaces or curved surfaces. The cross-sectional shapes of all the protrusions may be equal. Alternatively, at least one of the protrusions may have a cross-sectional shape different from the other protrusions, and all the protrusions may be arranged at equal intervals or may be arranged at unequal intervals.

In an embodiment, in the pixel defining regions formed with the protrusions, the pixel defining layer includes at least a first sub-pixel defining layer and a second sub-pixel defining layer. The first sub-pixel defining layer and the second sub-pixel defining layer are both disposed on the driving circuit layer, that is, the pixel defining layer is formed on the driving circuit layer by two or more times of coating, exposure, development, and curing processes.

In an embodiment, each of the first sub-pixel defining layer and the second sub-pixel defining layer has a planar surface away from the driving circuit layer, and a height of the first sub-pixel defining layer is greater than a height of the second sub-pixel defining layer.

In an embodiment, the first sub-pixel defining layer and the second sub-pixel defining layer have planar surfaces of a same height away from the driving circuit layer, and projections of the surfaces of the first sub-pixel defining layer and the second sub-pixel defining layer away from the driving circuit layer on the driving circuit layer are not connected with each other.

In an embodiment, a surface of at least one of the first sub-pixel defining layer and the second sub-pixel defining layer away from the driving circuit layer is formed with the protrusions in at least one of the pixel defining regions.

In an embodiment, all of the protrusions in each of the sub-pixel defining layers have a same cross-sectional shape, and the protrusions may have a trapezoidal cross-sectional shape, a rectangular cross-sectional shape, or other cross-sectional shapes.

In an embodiment, in each of the sub-pixel defining layers, at least one of the protrusions has a cross-sectional shape different from other protrusions.

In an embodiment, the cross-sectional shapes of the protrusions provided on the surfaces of the first sub-pixel defining layer and the second sub-pixel defining layer away from the driving circuit layer are same.

In an embodiment, the cross-sectional shapes of the protrusions provided on the surfaces of the first sub-pixel defining layer and the second sub-pixel defining layer away from the driving circuit layer are different.

In the OLED display panel of the present disclosure, in the pixel defining regions formed with the protrusions, the pixel defining layer may be integrally formed by one time of a coating, exposure, development, and curing process, or may be formed into at least two sub-pixel defining layers respectively disposed on the driving circuit layer by multiple times of coating, exposure, development, and curing processes. Alternatively, a portion of the pixel defining layer may have an integrally formed structure formed by one time of a process, and another portion of the pixel defining layer may be formed into at least two sub-pixel defining layers respectively disposed on the driving circuit layer by multiple times of processes.

In step S4, the light-emitting functional layer and the second electrode are finally deposited on the first electrode and the pixel defining layer for realizing electroluminescence.

When the OLED display panel is displayed, sub-pixels (not shown) located in the sub-pixel region are not simultaneously driven, and charges in the driven sub-pixels may enter into adjacent undriven sub-pixels along the light-emitting functional layer across a side and a top of the pixel defining layer, causing the undriven sub-pixels to faintly emit light, resulting in light leakage. Since the surface of the pixel defining layer is provided with protrusions in the at least one of the pixel defining regions away from the driving circuit layer, the lateral transmission path of the charges in the light emitting functional layer is increased compared to a structure of a planar top surface, thereby alleviating occurrence of light leakage, improving the display quality.

The present disclosure also provides an organic light-emitting diode (OLED) display device, including the OLED display panel in any of the above embodiments.

According to the above embodiments, it can be known that:

The present disclosure provides an organic light-emitting diode (OLED) display panel, including a substrate, a driving circuit layer, a pixel defining layer, and a light emitting functional layer. The driving circuit layer is formed on the substrate, and the pixel defining layer is formed on the driving circuit layer for defining a plurality of sub-pixel regions. The pixel defining layer includes a plurality of pixel defining regions. In the at least one pixel defining region, the pixel defining layer is protrusions a protrusion away from the surface of the driving circuit layer, and the light emitting functional layer is formed on the pixel defining layer and covers the sub-pixel region. By forming protrusions on the surface of the pixel defining layer away from the driving circuit layer, the lateral transmission path of charges between adjacent sub-pixels is increased, and the occurrence of light leakage is reduced.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. An organic light-emitting diode (OLED) display panel, comprising:
   a substrate;
   a driving circuit layer formed on the substrate;
   a pixel defining layer formed on the driving circuit layer for forming a plurality of sub-pixel regions, wherein the pixel defining layer comprises a plurality of pixel defining regions, and protrusions are provided on a surface of the pixel defining layer away from the driving circuit layer in at least one of the plurality of pixel defining regions; and
   a light emitting functional layer formed on the pixel defining layer and covering the plurality of sub-pixel regions, wherein the light emitting functional layer completely covers an upper surface of the pixel defining layer.

2. The OLED display panel according to claim 1, wherein the pixel defining layer is integrally formed in the at least one of the plurality of pixel defining regions.

3. The OLED display panel according to claim 2, wherein all of the protrusions have a same cross-sectional shape.

4. The OLED display panel according to claim 3, wherein the protrusions have a trapezoidal cross-sectional shape.

5. The OLED display panel according to claim 3, wherein the protrusions have a rectangular cross-sectional shape.

6. The OLED display panel according to claim 2, wherein at least one of the protrusions has a cross-sectional shape different from other protrusions.

7. The OLED display panel according to claim 1, wherein, in the at least one pixel defining region, the pixel defining layer comprises at least a first sub-pixel defining layer and a second sub-pixel defining layer, which are both disposed on the driving circuit layer.

8. The OLED display panel according to claim 7, wherein each of the first sub-pixel defining layer and the second sub-pixel defining layer has a planar surface away from the driving circuit layer, and a height of the first sub-pixel defining layer is greater than a height of the second sub-pixel defining layer.

9. The OLED display panel according to claim 7, wherein the first sub-pixel defining layer and the second sub-pixel defining layer have planar surfaces of a same height away from the driving circuit layer, and projections of the surfaces of the first sub-pixel defining layer and the second sub-pixel defining layer away from the driving circuit layer on the driving circuit layer are not connected with each other.

10. The OLED display panel according to claim 7, wherein a surface of at least one of the first sub-pixel defining layer and the second sub-pixel defining layer away from the driving circuit layer is provided with the protrusions in at least one of the pixel defining regions.

11. The OLED display panel according to claim 10, wherein all of the protrusions in each of the sub-pixel defining layers have a same cross-sectional shape.

12. The OLED display panel according to claim 11, wherein the protrusions have a trapezoidal cross-sectional shape.

13. The OLED display panel according to claim 11, wherein the protrusions have a rectangular cross-sectional shape.

14. The OLED display panel according to claim 10, wherein in each of the sub-pixel defining layers, at least one of the protrusions has a cross-sectional shape different from other protrusions.

15. The OLED display panel according to claim 11, wherein the cross-sectional shapes of the protrusions provided on the surfaces of the first sub-pixel defining layer and the second sub-pixel defining layer away from the driving circuit layer are same.

16. The OLED display panel according to claim 11, wherein the cross-sectional shapes of the protrusions provided on the surfaces of the first sub-pixel defining layer and the second sub-pixel defining layer away from the driving circuit layer are different.

17. The OLED display panel according to claim 1, wherein, in the pixel defining regions provided with the protrusions, a portion of the pixel defining layer has an integrally formed structure, and another portion of the pixel defining layer comprises at least a first sub-pixel defining layer and a second sub-pixel defining layer which are both disposed on the driving circuit layer.

18. A method of fabricating an organic light-emitting diode (OLED) display panel, comprising:
    providing a substrate;
    forming a driving circuit layer on the substrate;
    forming a pixel defining layer on the driving circuit layer, the pixel defining layer being configured to comprise and define a plurality of sub-pixel regions, and providing protrusions on a surface of the pixel defining layer away from the driving circuit layer in at least one of the pixel defining regions; and
    forming a light emitting functional layer on the pixel defining layer and in the plurality of sub-pixel regions, wherein the light emitting functional layer completely covers an upper surface of the pixel defining layer.

19. The method of fabricating an OLED display panel according to claim 18, wherein the step of forming a pixel defining layer on the driving circuit layer, the pixel defining layer being configured to comprise and define a plurality of sub-pixel regions, and providing protrusions on a surface of the pixel defining layer away from the driving circuit layer in at least one of the pixel defining regions comprises: integrally forming a pixel defining layer in the at least one of the pixel defining regions.

20. The method of fabricating an OLED display panel according to claim 18, wherein the step of forming a pixel defining layer on the driving circuit layer, the pixel defining layer being configured to comprise and define a plurality of sub-pixel regions, and providing protrusions on a surface of the pixel defining layer away from the driving circuit layer in at least one of the pixel defining regions comprises: forming at least a first sub-pixel defining layer and a second sub-pixel defining layer in the at least one of the pixel defining regions, wherein the first sub-pixel defining layer and the second sub-pixel defining layer are both disposed on the driving circuit layer.

* * * * *